United States Patent

Watson et al.

(10) Patent No.: US 7,688,421 B2
(45) Date of Patent: Mar. 30, 2010

(54) FLUID PRESSURE COMPENSATION FOR IMMERSION LITHOGRAPHY LENS

(75) Inventors: Douglas C. Watson, Campbell, CA (US); W. Thomas Novak, Hillsborough, CA (US)

(73) Assignee: Nikon Corporation, Tokyo (JP)

( * ) Notice: Subject to any disclaimer, the term of this patent is extended or adjusted under 35 U.S.C. 154(b) by 516 days.

(21) Appl. No.: 11/628,942

(22) PCT Filed: Dec. 20, 2004

(86) PCT No.: PCT/US2004/042808

§ 371 (c)(1),
(2), (4) Date: Dec. 8, 2006

(87) PCT Pub. No.: WO2006/009573

PCT Pub. Date: Jan. 26, 2006

(65) Prior Publication Data

US 2008/0316445 A1    Dec. 25, 2008

Related U.S. Application Data

(60) Provisional application No. 60/580,510, filed on Jun. 17, 2004.

(51) Int. Cl.
*G03B 27/42* (2006.01)
*G03B 27/52* (2006.01)
*G03B 27/32* (2006.01)

(52) U.S. Cl. .............................. 355/53; 355/30; 355/55; 355/77

(58) Field of Classification Search .................. 355/30, 355/53, 72, 77, 55
See application file for complete search history.

(56) References Cited

U.S. PATENT DOCUMENTS

| 5,296,891 | A | 3/1994 | Vogt et al. |
| 5,523,193 | A | 6/1996 | Nelson |
| 5,610,683 | A | 3/1997 | Takahashi |
| 7,295,283 | B2 * | 11/2007 | Cox et al. ..................... 355/30 |

(Continued)

FOREIGN PATENT DOCUMENTS

DE    224 448 A1    7/1985

(Continued)

OTHER PUBLICATIONS

Japanese document S63-157419 dated (Jun. 1988).*

*Primary Examiner*—Alan A Mathews
(74) *Attorney, Agent, or Firm*—Oliff & Berridge, PLC

(57) ABSTRACT

An immersion lithography system that compensating for any displacement of the optical caused by the immersion fluid. The system includes an optical assembly (14) to project an image defined by the reticle (12) onto the wafer (20). The optical assembly includes a final optical element (16) spaced from the wafer by a gap (24). An immersion element (22) is provided to supply an immersion fluid into the gap and to recover any immersion fluid that escapes the gap. A fluid compensation system is provided for the force on the final optical element of the optical assembly caused by pressure variations of the immersion fluid. The resulting force created by the varying pressure may cause final optical element to become displaced. The fluid compensation system is configured to provide a substantially equal, but opposite force on the optical assembly, to prevent the displacement of the final optical element.

27 Claims, 7 Drawing Sheets

U.S. PATENT DOCUMENTS

| | | | |
|---|---|---|---|
| 7,352,434 B2 * | 4/2008 | Streefkerk et al. | 355/53 |
| 7,486,381 B2 * | 2/2009 | Streefkerk et al. | 355/55 |
| 2004/0114117 A1 | 6/2004 | Bleeker | |
| 2004/0207824 A1 * | 10/2004 | Lof et al. | 355/30 |
| 2004/0257544 A1 | 12/2004 | Vogel et al. | |
| 2005/0007569 A1 | 1/2005 | Streefkerk et al. | |
| 2005/0018156 A1 | 1/2005 | Mulkens et al. | |
| 2005/0030498 A1 | 2/2005 | Mulkens | |
| 2005/0174550 A1 | 8/2005 | Streefkerk et al. | |
| 2005/0219481 A1 | 10/2005 | Cox et al. | |
| 2005/0259233 A1 | 11/2005 | Streefkerk et al. | |
| 2005/0259234 A1 | 11/2005 | Hirukawa et al. | |
| 2005/0270506 A1 | 12/2005 | Streefkerk et al. | |
| 2006/0114445 A1 | 6/2006 | Ebihara | |
| 2006/0119810 A1 | 6/2006 | Cadee | |
| 2006/0126045 A1 | 6/2006 | Ono et al. | |
| 2006/0139613 A1 | 6/2006 | Houkes et al. | |
| 2006/0209278 A1 | 9/2006 | Kiuchi et al. | |
| 2007/0081136 A1 | 4/2007 | Hara | |
| 2007/0177118 A1 | 8/2007 | Sogard | |

FOREIGN PATENT DOCUMENTS

| | | |
|---|---|---|
| EP | 1 420 298 A2 | 5/2004 |
| EP | 1 489 462 A2 | 12/2004 |
| EP | 1 503 244 A1 | 2/2005 |
| EP | 1 669 805 A2 | 6/2006 |
| EP | 1 703 548 A1 | 9/2006 |
| JP | A-59-19912 | 2/1984 |
| JP | A 62-065326 | 3/1987 |
| JP | A 63-157419 | 6/1988 |
| WO | WO 98/33096 | 7/1998 |
| WO | WO 98/38597 | 9/1998 |
| WO | WO 2004/053955 A1 | 6/2004 |
| WO | WO 2004/090634 A1 | 10/2004 |
| WO | WO 2004/114380 A1 | 12/2004 |
| WO | WO 2005/006416 A1 | 1/2005 |
| WO | WO 2005/006417 A1 | 1/2005 |
| WO | WO 2005/024517 | 3/2005 |
| WO | WO 2005/067013 A1 | 7/2005 |
| WO | WO 2005/093791 A1 | 10/2005 |
| WO | WO 2006/007111 A2 | 1/2006 |

* cited by examiner

FLUID PRESSURE COMPENSATION FOR IMMERSION LITHOGRAPHY LENS

RELATED APPLICATIONS

This application claims priority from Provisional Application Ser. No. 60/580,510 filed on Jun. 17, 2004 entitled "Fluid Pressure Compensation for Immersion Lithography," the contents of which are incorporated by reference herein for all purposes.

BACKGROUND

The present invention relates generally to lithography, and more particularly, to an apparatus and method for compensating for pressure exerted on the lithography lens caused by the immersion fluid.

A lithography apparatus is used to transfer images defined by a reticle or other patterning element such as a programmable mirror array (see U.S. Pat. Nos. 5,296,891, 5,523,193 and PCT applications 98/38597 and 98/33096 for example, all incorporated by reference herein) onto a semiconductor wafer during fabrication. A typical lithography apparatus includes an illumination source, a reticle stage assembly for positioning the reticle, a wafer stage for supporting the wafer, and an optical assembly including lenses for projecting the image defined by the reticle onto the wafer. Control and measurement systems are also provided to control the movement of the wafer and measure the position of the wafer relative to the optical assembly respectively.

Immersion lithography systems utilize a layer of immersion fluid that fills a gap between the final lens of the optical assembly and the wafer. The fluid enhances the resolution of the system by enabling exposures with numerical apertures (NA) greater than one, which is the theoretical limit for conventional "dry" lithography. The fluid in the gap permits the exposure with light that would otherwise be totally internally reflected at the optical-air interface. With immersion lithography, numerical apertures as high as the index of refraction of the immersion fluid are possible. Fluid immersion also increases the depth of focus, which is the tolerable error in the vertical position of the wafer, compared to a conventional lithography system. Immersion lithography thus has the capability of providing resolution down to 50 nanometers or lower.

One potential issue with immersion lithography is that fluid pressure on the lens may cause the last lens of the optical assembly to become displaced. More specifically, the amount of force on the lens depends on the pressure exerted by the fluid and the size of the surface area of the lens, lens mount hardware, and any immersion fluid supply nozzles attached to the lens mount hardware.

The fluid pressure may be caused by a number of reasons. With immersion lithography, the surface tension of the liquid at the air-fluid interface surrounding the exposure area, sometimes referred to as the meniscus, has the effect of sucking or pulling down the lens and optical assembly. Variations in the amount of immersion fluid may also cause pressure variations on the lens. The applicants have found that a positive or negative change of only 0.02 cubic centimeters will cause a change of force of approximately 50 milli-newtons on the lens with an 80 millimeter diameter. Also as water escapes the gap, the water flow also has a tendency to create a pull down force on the lens. Dynamic motion of the wafer in the horizontal plane can cause shear forces that exert pressure on the lens. Vertical motions of the wafer performed for focusing purposes may also cause unwanted vibrations or vertical coupling of the lens.

Excessive forces exerted on the last lens of the optical assembly can cause a number of problems during exposure operation. If the force causes the lens to be displaced, the resulting image projected onto the wafer may be out of focus. On the other hand, if the optical assembly is too rigidly mounted to prevent the displacement, lens aberrations may result due to thermal expansion, again resulting in a blurring of the projected image.

An apparatus and method for compensating for pressure exerted on the lithography lens caused by the immersion fluid is therefore needed.

SUMMARY

The present invention is related to an immersion lithography system that compensates for any displacement of the final optical element of the optical assembly caused by the immersion fluid. The system includes an optical assembly to project an image defined by the reticle onto the wafer. The optical assembly includes a final optical element spaced from the wafer by a gap. An immersion element is provided to supply an immersion fluid into the gap and to recover any immersion fluid that escapes the gap. A fluid compensation system is provided to compensate for the force on the final optical element of the optical assembly caused by pressure variations of the immersion fluid to minimize the displacement of the final optical element. The resulting force created by the varying pressure may cause the final optical element to become displaced. The fluid compensation system is configured to provide a substantially equal, but opposite force on the optical assembly, to prevent the displacement of the final optical element.

BRIEF DESCRIPTION OF THE DRAWINGS

Like reference numbers refer to like elements in the Figures.

DESCRIPTION

Figure 1:
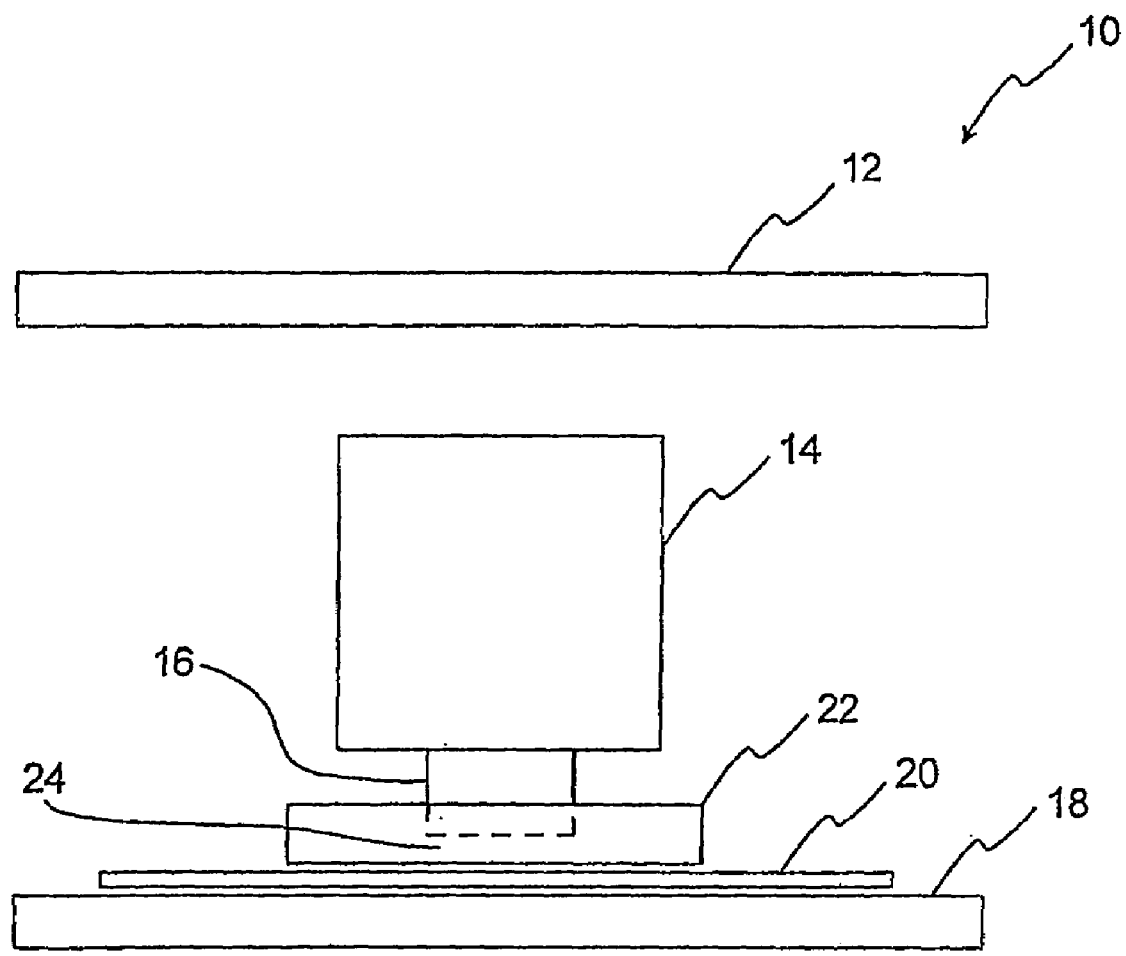
FIG. 1 is an illustration of an immersion apparatus having features of the present invention.

Referring to FIG. 1, an immersion apparatus is shown. The immersion apparatus 10 includes a reticle stage 12, an optical assembly 14 including a final optical element 16, and a wafer stage 18 for supporting a wafer 20. An immersion device 22, sometimes referred to as a nozzle, is positioned between the final optical element 16 and the wafer 20 on the wafer stage 18. The immersion device is responsible for supplying fluid into the gap 24 between the final optical element 16 and the wafer 20. The immersion device is also responsible for recovering immersion fluid that escapes the gap 24. In various embodiments, the immersion fluid may be a liquid such as water or oil. For more details on the immersion device, see PCT Application No. PCT/US04/22915, filed Jul. 16, 2004, entitled "Apparatus and Method for Providing Fluid for Immersion Lithography" (corresponding to U.S. patent application Ser. No. 11/362,833, published as U.S. 2006/0152697), assigned to the assignee of the present invention, and incorporated by reference herein for all purposes or a gas seal as described in European Application EP 1 420 298 A2, also incorporated by reference herein.

Figure 2:
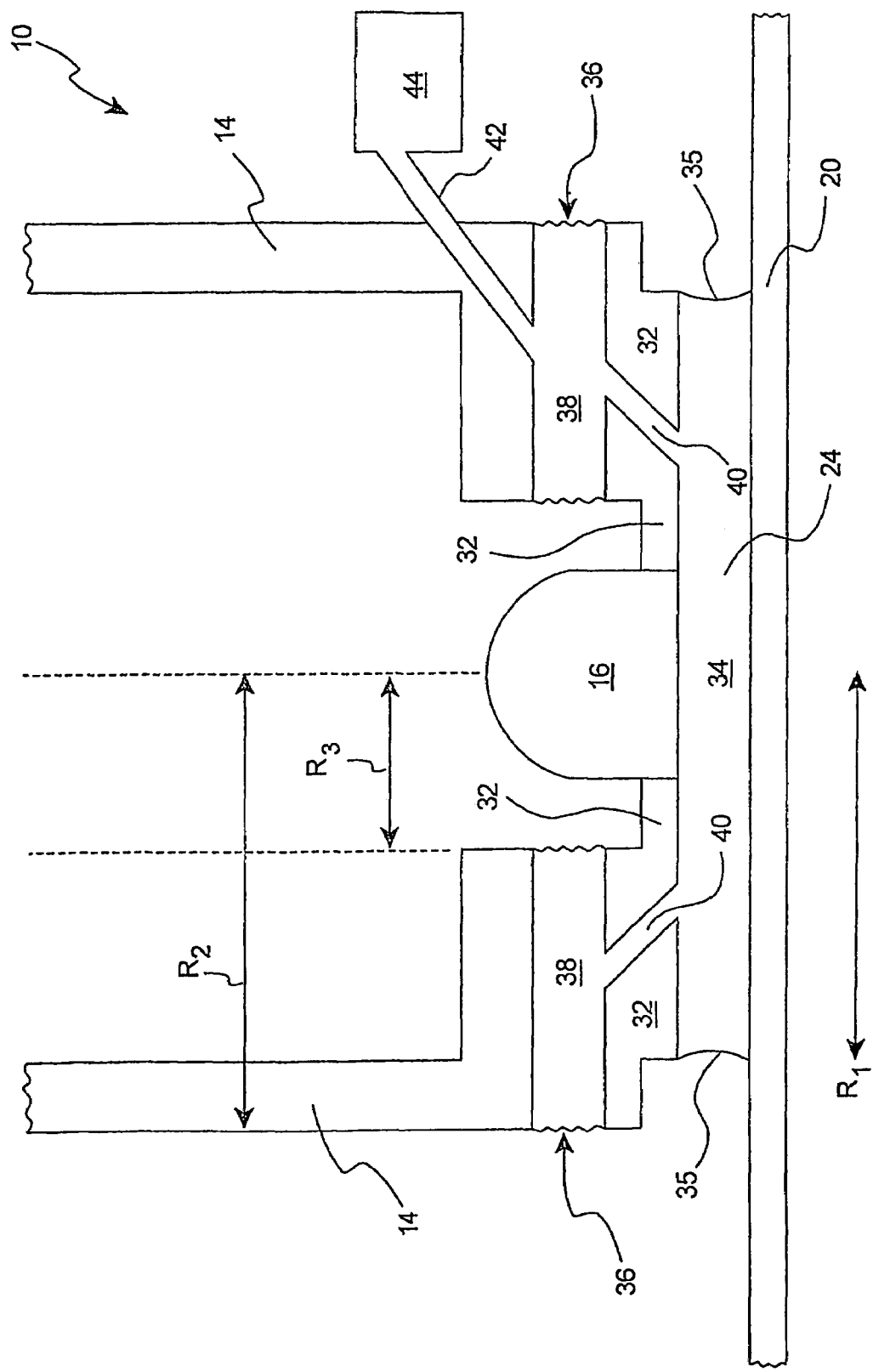
FIG. 2 is an enlarged view of a fluid pressure compensation system for an immersion lithography lens according to one embodiment of the invention.

Referring to FIG. 2, an enlarged cross-section view of a fluid pressure compensation system for an immersion lithography apparatus according to one embodiment of the invention is shown. The apparatus 10 includes a lens mount 32 used to mount the final optical element 16 to the optical assembly 14. The final optical element 16 is positioned over the wafer 20. The immersion device 22 (not shown for the sake of simplicity in FIG. 2) is responsible for providing and recovering immersion fluid 34 from the gap 24. A meniscus 35 of immersion fluid is created at the fluid-atmosphere interface below the outer-edge of the lens mount 32.

A fluid compensation system 36 is provided to compensate for any changes in the force on the final optical element 16 caused by changes in the pressure of fluid 34. The fluid compensation system 36 includes a chamber 38 that surrounds the last optical element 16 and is positioned between the optical assembly 14 and the lens mount 32. The chamber is filled with immersion fluid 34. Passages 40 fluidly couple the immersion fluid 34 in the gap 24 with the chamber 38. A purge device 44 is fluidly coupled to the chamber 38 through a passage 42. For the purposes of this application, the chamber 38 is generically characterized as a device that is capable of expanding or contracting in the vertical direction but not in the horizontal direction. In various embodiments, the chamber 38 may be a bellows, piston, diaphragm, or other passive pressure responsive device. The passages 40 and 42 may be a duct or other opening fluidly connecting the immersion fluid 34 in the gap with the chamber 38 and purge device 44.

During operation, changes in the pressure of the immersion fluid 34 may create forces on the final optical element 16, the lens mount 32, and the immersion device, all of which may result in displacement of the final optical element 16. The chamber 38 is designed to create an equal but opposite force to compensate or cancel out the force created by the immersion fluid 34. When pressure caused by the immersion fluid 34 in the gap 24 increases, an upward force is created on the final optical element 16. The increased pressure concurrently causes a corresponding increase in the pressure in the chamber 38 via the passages 40. The increased pressure results in the expansion of the chamber 38, creating an equal but opposite downward force on the lens mount 32. As a result, the final optical element 16 is not displaced. Alternatively, if the pressure of the immersion fluid 34 decreases in the gap 24, a downward force on the final optical element 16 is created. The decreased pressure results in a corresponding decrease in pressure in the chamber 38. Consequently, the chamber 38 compresses, causing an equal but opposite upward force on the lens mount 32. As a result, the final optical element 16 is not displaced.

In one embodiment, the horizontal surface area of the top and bottom surfaces of the lens mount 32 in contact with the chamber 38 and immersion fluid 34 are substantially the same. The substantially equal surface area ensures that the chamber 38 exerts an equal but opposite force on the top surface of the lens mount 32 as the immersion fluid 34 exerts on the bottom surface of the mount 32 and the final optical element 16 combination. Assume in FIG. 2 that the bottom surface of the lens mount 32 has a radius $R_1$ and the inner and the optical assembly 14 has an outer and inner radius $R_2$ and $R_3$ respectively. When the equation $\pi R_1^2 = \pi R_2^2 - \pi R_3^2$ is satisfied, then the top and bottom surface areas in contact with the chamber 38 and immersion fluid 34 are substantially the same. For example, this relationship is satisfied when $R_1=4$, $R_2=5$ and $R_3=3$ measurement units respectively. Although in this example the lens mount 32 and the optical assembly 14 are round, this shape should not be construed as limiting the present invention. In various embodiments, the lens mount 32 and optical assembly 14 can be any shape, including but not limited to square, rectangular, oval, etc. In other embodiments, the equal but opposite forces on the bottom and top surfaces of the lens and lens mount are substantially vertically aligned.

Figure 3:
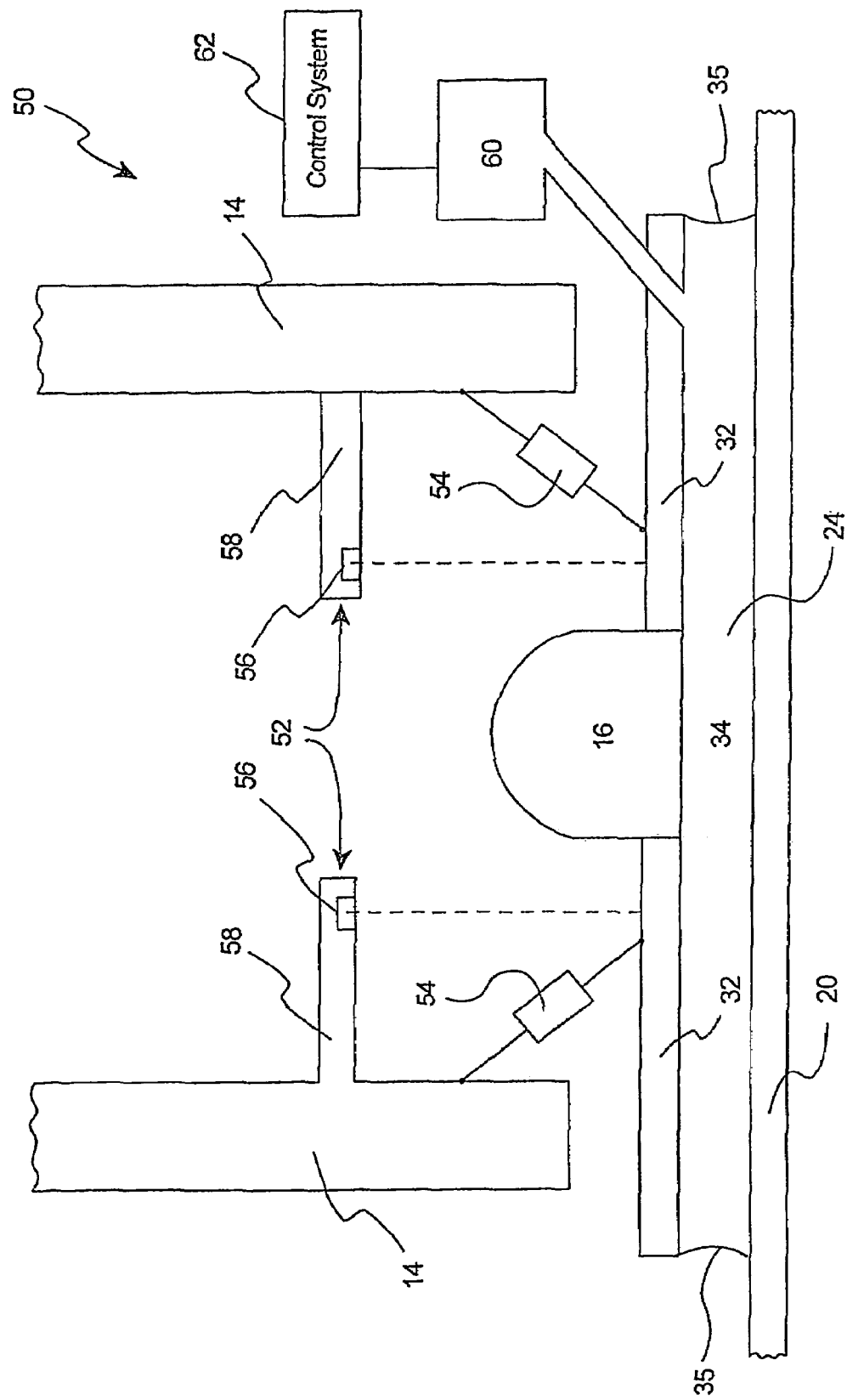
FIG. 3 is a model diagram of a fluid pressure compensation system for an immersion lithography lens according to a second embodiment of the invention.

Referring to FIG. 3, a diagram of a fluid pressure compensation system for an immersion lithography apparatus according to another embodiment of the invention is shown. The apparatus 50 includes a lens mount 32 used to mount the final optical element 16 to the optical assembly 14. The final optical element 16 is positioned over the wafer 20. The immersion device 22 (again not shown for the sake of simplicity in FIG. 3) is responsible for providing and recovering immersion fluid 34 from the gap 24. A meniscus 35 of immersion fluid is created at the fluid-atmosphere interface below the outer-edge of the lens mount 32.

A fluid compensation system 52 is provided to compensate for any changes in the force on the final optical element 16 caused by changes in the pressure of fluid 34. The fluid compensation system 52 includes a pair of actuators 54 mechanically coupled between the lens mount 32 and the sidewalls of the optical assembly 14. Optical position sensors 56, mounted on struts 58 that extend from the sidewalls of the optical assembly, are provided to measure the relative position of the lens mount 32 with respect to the optical assembly 14. A pressure sensor 60 is used to measure the pressure of the immersion fluid 34 in the gap 24. A control system 62, coupled to both the pressure sensor 60 and the position sensors 56, is used to control the actuators 54.

During immersion lithography, the immersion fluid 34 may become pressurized, either positively or negatively, for the reasons described above. This pressure is applied to the bottom surface of the lens mount 32, last optical element 16, and the nozzle, all of which may contribute to the displacement of the final optical element 16. Pressure variations of the immersion fluid 34 are continuously provided to the control system 62 as measured by the pressure sensor 60. The position sensors 56 also measure the actual position of the lens 20, mount 32. The control system 62 in turn controls the actuators in real time to compensate for any displacement of the final optical element 16 caused by changes in pressure and detected by the position sensors 56. For example, when an increase in pressure causes the final optical element to be displaced upward, the control system 62 directs the actuators to exert an equal but opposite downward force on the lens mount 32. Alternatively, the control system 62 causes the actuators 54 to exert an upward force on the lens mount 32 when the sensor 60 measures a decrease in immersion fluid 34 pressure. In either case, the actuators 54 prevent the displacement of the final optical element 16. In various other embodiments, the control system 62 may use inputs from the position sensors 56 and the pressure sensor 60 to control the actuators.

Alternatively, the control system may use inputs from either the position sensors 56 or the pressure sensor 60, but not both. In yet another embodiment, the actuators may be internal to the lens mount 32, as opposed to being mechanically coupled between the lens mount 32 and the optical assembly 14.

Figure 4:
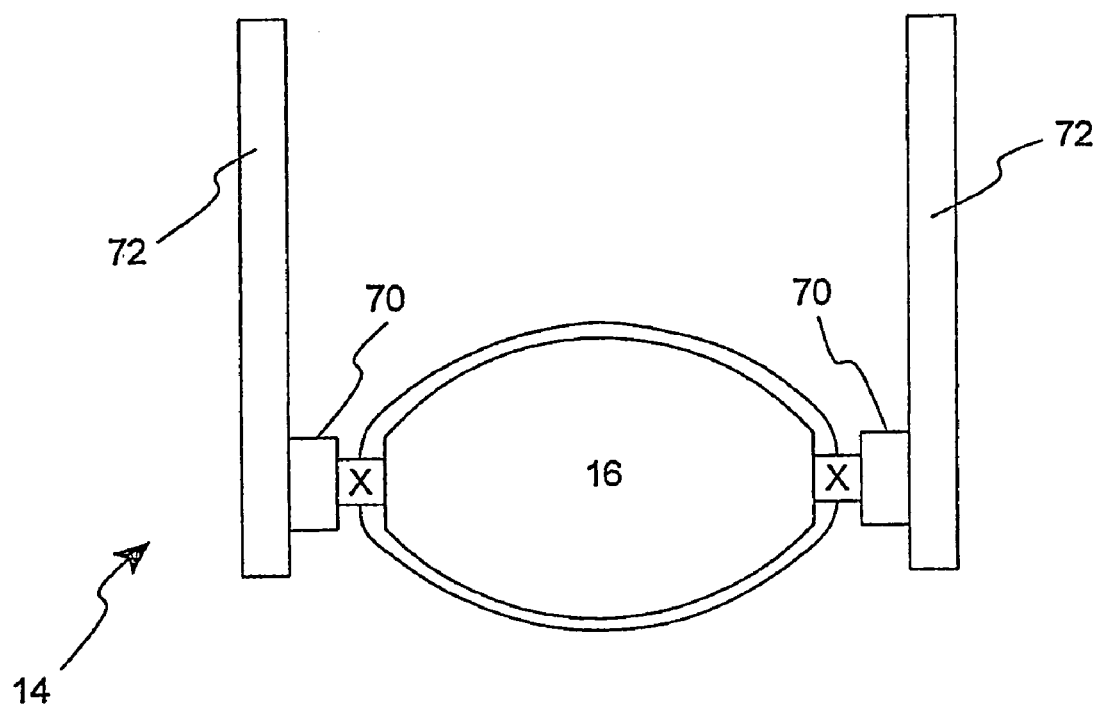
FIG. 4 is a diagram of the optical assembly clamping the final optical element according to one embodiment of the invention.
Figures 5A, 5B:
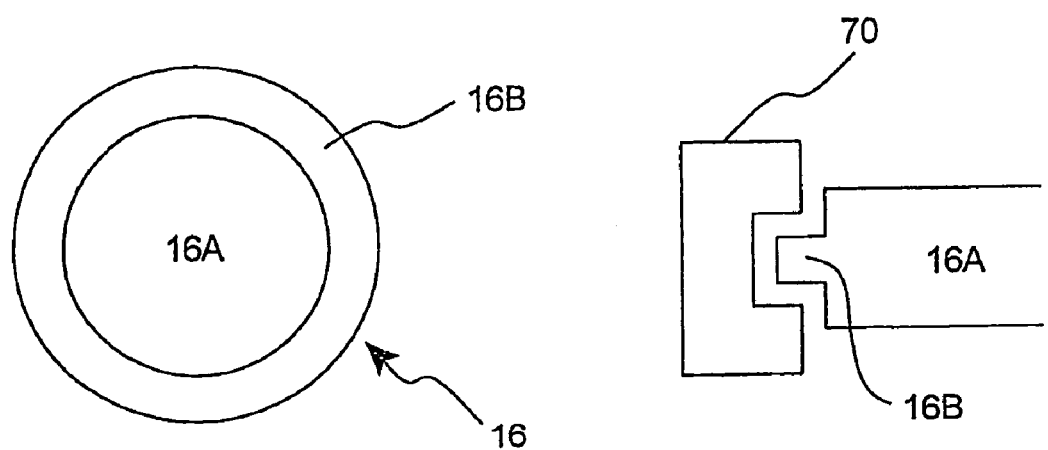
FIGS. 5A and 5B are diagrams of the final optical element and clamp according to one embodiment of the invention.

Referring to FIG. 4, an enlarged diagram of the optical assembly 14 is shown. In one embodiment, kinematic clamps 70 are used to clamp the final optical element 16 to lens barrels 72 of the optical assembly 14. Referring to FIG. 5A, a top view of the final optical element 16 is shown. As is illustrated in the figure, the optical element includes a lens portion 16a and a flanged portion 16b extending around the periphery of the optical element 16. Referring to FIG. 5B, a cross section view of the final optical element 16 and a clamp 70 is shown. The clamp 70 is configured to clamp onto the flanged portion 16b of the final optical element 16 to hold it in place within the optical assembly 14. Although the clamp 70 is described herein as a kinematic clamp, it should be noted that any type of mechanical clamp may be used. In yet another embodiment, glue may be used to secure the final optical element 16 to the barrels 72 of the optical assembly 14. For the sake of simplicity, only one clamp 70 is shown. It should be noted that typically two, three or even more clamps 70 may be used around the circumference of the final optical element 16. In embodiments where glue is used, separate or non-clamp actuators can be used to compensate for any displacement of the final optical element 16, similar to as illustrated in the diagram of FIG. 3.

In one embodiment, the clamps 70 are the force actuators and are responsible for both holding the final optical element 16 in place within the optical assembly 14 and for providing the equal but opposite force to compensate for any displacement caused by the immersion fluid, similar to the actuators 54 of FIG. 3. In various embodiments, the force actuators may be VCMs, EI cores, a low stiffness piezo stack, piezo bi-morph, or other magnetic or pressure driven actuators. Regardless of the type of force actuator used, the force applied by the clamps 70 to the kinematic mount should be equal to but opposite the direction of the force created by the immersion fluid 34. Furthermore, the forces created by each mount can be controlled by the control system 62 so that the center of the effort coincides with center of the fluid force.

In the aforementioned embodiments, the control system 62 relies on both an actual instantaneous force calculation as measured by the pressure sensors 60 and position feedback as measured by the optical position sensors 56. For example, the instantaneous force is calculated by multiplying the instantaneous pressure times the surface area of the final optical element 16, lens mount 32, and immersion element 22 in contact with the immersion fluid. An instantaneous counter-force can then be applied based on the outcome of the calculation. The position sensors 56 can be used for feedback to adjust the counter-force as necessary. In other embodiments, however, the control system 62 may rely on either the instantaneous force calculation as measured by the pressure sensors 60 (i.e., an open loop system) or the position feedback as measured by the optical position sensors 56 (i.e., a closed loop system), but not both.

According to various embodiments, the immersion apparatus 10 can be used as a scanning type photolithography system that exposes the pattern from a reticle onto the wafer with the reticle and the wafer moving synchronously. In a scanning type lithographic apparatus, the reticle is moved perpendicularly to an optical axis of the optical assembly by a reticle stage assembly and the wafer is moved perpendicularly to the optical axis of the optical assembly 14 by a wafer stage assembly. Scanning of the reticle and the wafer occurs while the reticle and the wafer are moving synchronously.

Alternatively, the immersion apparatus 10 can be a step-and-repeat type photolithography system that exposes the reticle while the reticle and the wafer are stationary. In the step and repeat process, the wafer may be in a constant position relative to the reticle and the optical assembly 14 during the exposure of an individual field. Subsequently, between consecutive exposure steps, the wafer is consecutively moved with the wafer stage assembly perpendicularly to the optical axis of the optical assembly 14 so that the next field of the wafer is brought into position relative to the optical assembly 14 and the reticle for exposure. Following this process, the images on the reticle are sequentially exposed onto the fields of the wafer, and then the next field of the wafer is brought into position relative to the optical assembly 14 and the reticle.

As is well known in the art, the immersion apparatus 10 also includes an illumination system (not shown) having an illumination source and an illumination optical assembly. The illumination source emits a beam (irradiation) of light energy. The illumination optical assembly guides the beam of light energy from the illumination source to the optical assembly 14. The illumination source can be a g-line source (436 nm), an i-line source (365 nm), a KrF excimer laser (248 nm), an ArF excimer laser (193 nm) or a $F_2$ laser (157 nm).

Figure 6A:
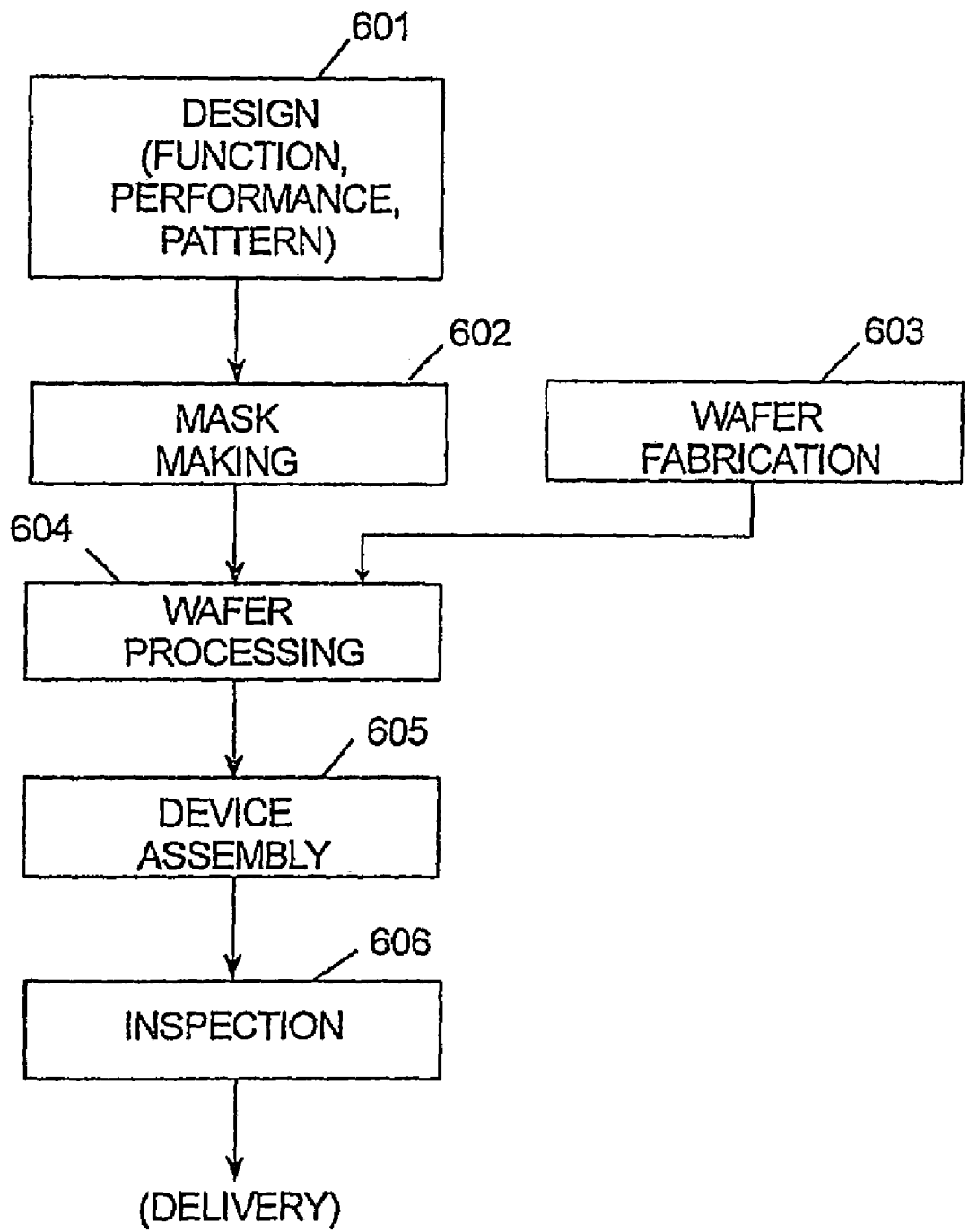
FIGS. 6A and 6B are flow diagrams illustrating the fabrication of semiconductor devices using the immersion apparatus of the present invention.

Semiconductor devices can be fabricated using the above described systems, by the process shown generally in FIG. 6A. In step 601 the device's function and performance characteristics are designed. Next, in step 602, a mask (reticle) having a pattern is designed according to the previous designing step, and in a parallel step 603 a wafer is made from a silicon material. The mask pattern designed in step 602 is exposed onto the wafer from step 603 in step 604 by a photolithography system described hereinabove in accordance with the present invention. In step 605 the semiconductor device is assembled (including the dicing process, bonding process and packaging process), finally, the device is then inspected in step 606.

Figure 6B:
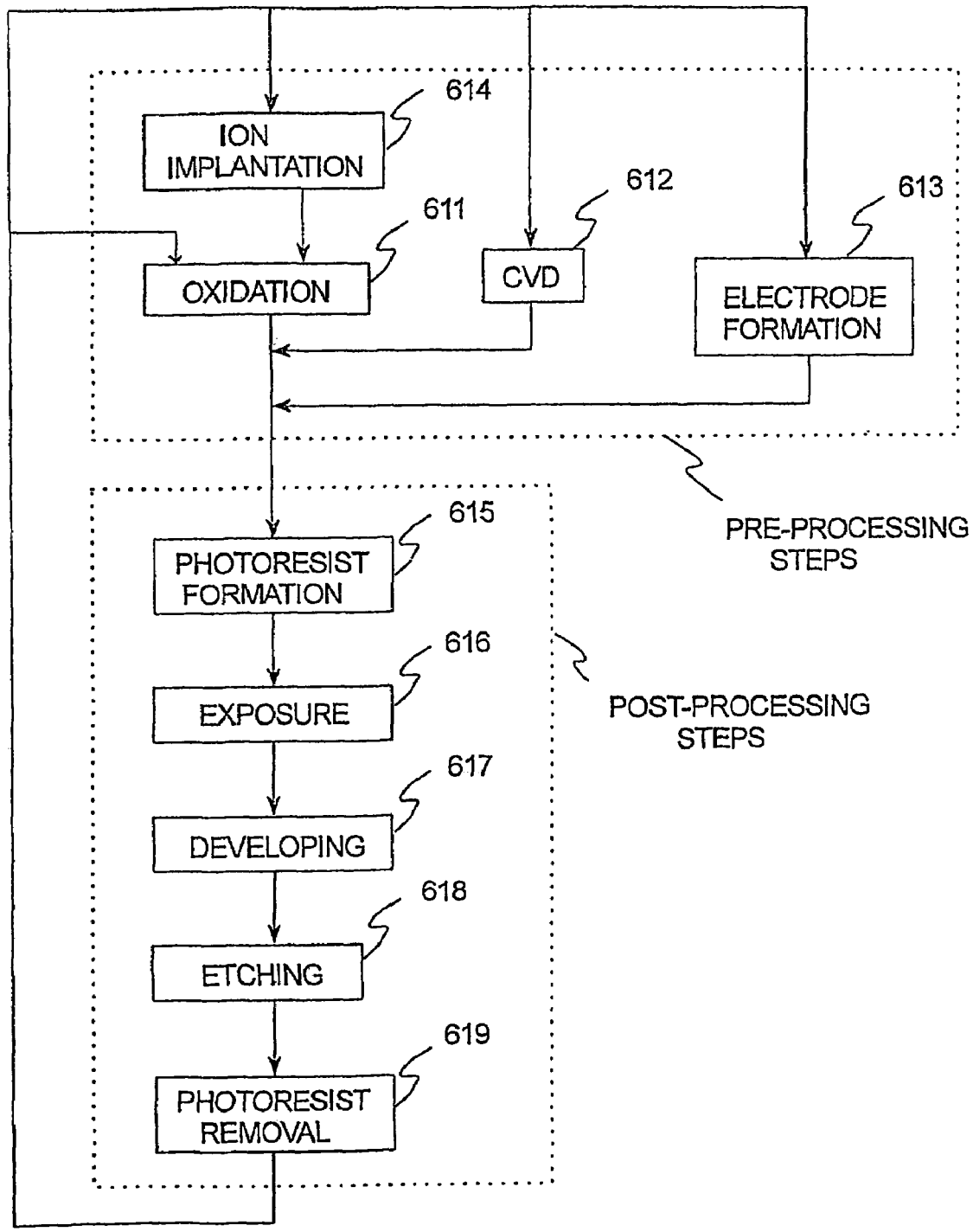

FIG. 6B illustrates a detailed flowchart example of the above-mentioned step 604 in the case of fabricating semiconductor devices. In FIG. 6B, in step 611 (oxidation step), the wafer surface is oxidized. In step 612 (CVD step), an insulation film is formed on the wafer surface. In step 613 (electrode formation step), electrodes are formed on the wafer by vapor deposition. In step 614 (ion implantation step), ions are implanted in the wafer. The above mentioned steps 611-614 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 615 (photoresist formation step), photoresist is applied to a wafer. Next, in step 616 (exposure step), the above-mentioned exposure device is used to transfer the circuit pattern of a mask (reticle) to a wafer. Then in step 617 (developing step), the exposed wafer is developed, and in step 618 (etching step), parts other than residual photoresist (exposed material surface) are removed by etching. In step 619 (photoresist removal step), unnecessary photoresist remaining after etching is removed.

Multiple circuit patterns are formed by repetition of these preprocessing and post-processing steps.

Figure 7A:
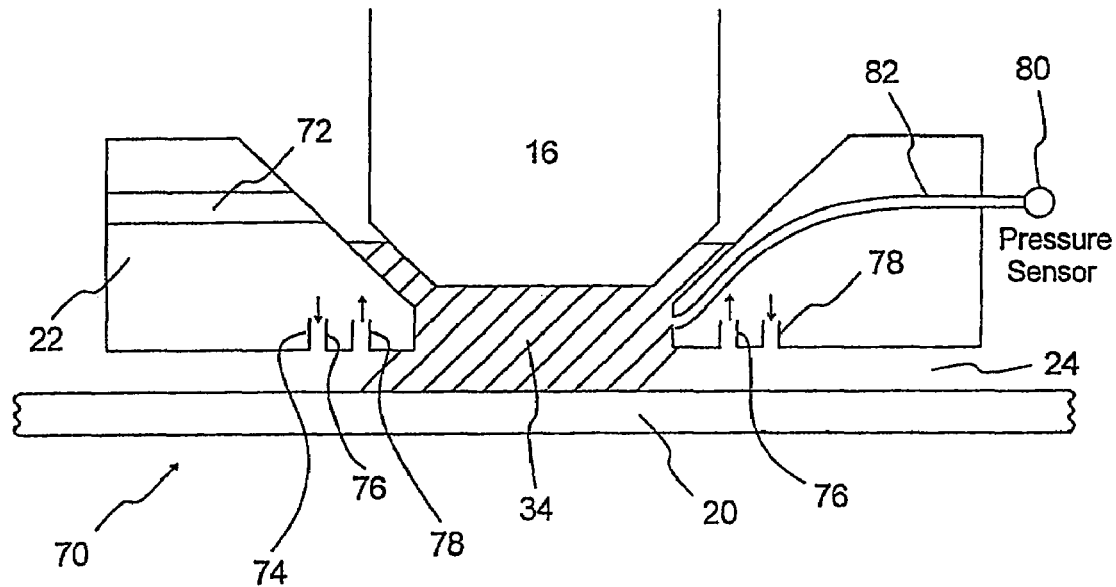
FIGS. 7A and 7B are diagrams of a fluid pressure compensation system for an immersion lithography apparatus according to another embodiment of the invention.

Referring to FIG. 7A, a fluid pressure compensation system for an immersion lithography apparatus according to another embodiment of the invention is shown. The apparatus

70 includes a lens mount (not shown) used to mount the final optical element 16 to the optical assembly 14 (not shown). The final optical element 16 is positioned over the wafer 20. The immersion device 22 is responsible for providing and recovering immersion fluid 34 from the gap 24. An immersion fluid duct 72 is provided to supply immersion fluid into the gap 24. A gas seal 74 including air nozzle 76 for providing pressurized air or gas and a vacuum port 78 are provided around the periphery of the gap 24. The gas seal is used to confine or seal the immersion fluid 34 in the gap. In various embodiments, the air seal 74 may contain two or more air nozzles 76 and/or vacuum ports 78. The gas seal and/or bearing 74 may also be used as an air or gas bearing to support the immersion element 22 over the wafer 20. For more details on the gas seal 74, see European Patent Application EP 1 420 298 A2 incorporated by reference herein for all purposes. The apparatus 70 further includes a pressure sensor 80 fluidly coupled to the immersion fluid 34 in the gap by a duct 82. The pressure sensor 80 is used to measure the pressure of the immersion fluid 34 in the gap 24. The pressure information can then be used to control the velocity of the gas or air exiting nozzle 76 to selectively adjust the height of the gap 24 between the wafer 20 and the immersion device 22. In other words, the velocity of the air or gas exiting the one or more nozzles 76 can be selectively adjusted to control the force used to support the immersion device 22.

Figure 7B:
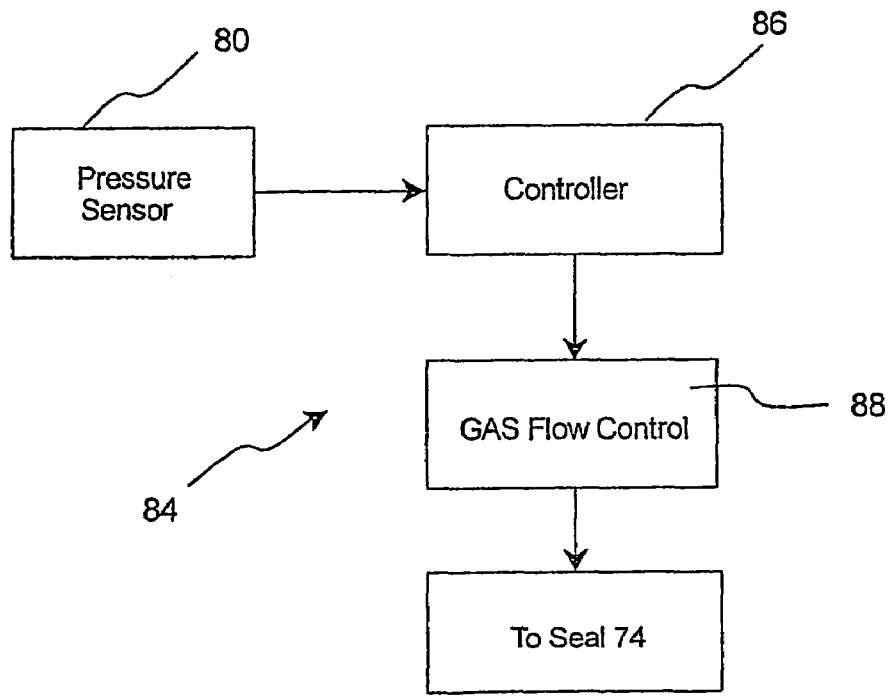

Referring to FIG. 7B, a block diagram of a control system 84 is shown. The pressure sensor 80 provides instantaneous pressure measurements to the controller 86. In turn, the controller generates control signals to a gas flow controller 88. The gas flow controller 88 controls the velocity and pressure of the gas exiting the nozzle or nozzles 76 of the gas seal 74. By controlling the pressure and velocity, the gap 24 between the wafer 20 and the immersion device 22 can be selectively controlled. For example, the pressure and velocity can be altered on the fly to maintain a constant gap 24 as the pressure of the immersion fluid varies. Alternatively, the pressure and velocity can be altered to selectively control the height of the gap. In various embodiments, the controller 86 and gas flow control can be one device or separate devices.

While the particular exposure apparatus as shown and disclosed herein is fully capable of obtaining the objects and providing the advantages herein before stated, it is to be understood that it is merely illustrative of the presently preferred embodiments of the invention and that no limitations are intended to the details of construction or design herein shown other than as described in the appended claims.

What is claimed is:

1. An apparatus, comprising:
   a wafer table that supports a wafer;
   an optical assembly that projects an image onto the wafer supported by the wafer table, the optical assembly having a final optical element spaced from the wafer by a gap;
   an immersion element that provides an immersion fluid into the gap between the final optical element and the wafer; and
   a fluid compensation system that compensates for a first force applied to the final optical element of the optical assembly caused by pressure variations of the immersion fluid to minimize displacement of the final optical element, the fluid compensation system applying a second force to the final optical element, the second force having a direction opposite a direction of the first force.

2. The apparatus of claim 1, wherein the fluid compensation system comprises a chamber positioned adjacent a lens mount that holds the final optical element with respect to the optical assembly.

3. The apparatus of claim 2, further comprising passages fluidly coupled between the gap and the chamber.

4. The apparatus of claim 2, wherein the chamber passively compensates for displacement of the final optical element by exerting the second force on the lens mount to oppose the first force exerted by the immersion fluid onto the lens mount and/or the final optical element.

5. The apparatus of claim 4, wherein the second force is substantially equal but opposite the first force.

6. The apparatus of claim 2, wherein the lens mount has a first surface in contact with the immersion fluid and a second surface in contact with the chamber.

7. The apparatus of claim 2, wherein the fluid compensation system further comprises a purge device fluidly coupled to the chamber.

8. The apparatus of claim 2, wherein the chamber expands or contracts in a vertical direction but not in a horizontal direction.

9. The apparatus of claim 2, wherein the chamber is a passive pressure device.

10. The apparatus of claim 9, wherein the passive pressure device comprises one of the following: a bellows, a piston, or a diaphragm.

11. The apparatus of claim 1, wherein the fluid compensation system further comprises:
    a control system that calculates the first force exerted on the final optical element and generates a control signal commensurate with the calculated first force; and
    at least one force actuator, responsive to the control signal, and that applies the second force to the final optical element, the second force is equal but opposite the first force to prevent displacement of the final optical element.

12. The apparatus of claim 11, wherein the at least one force actuator is mechanically coupled between a lens mount that holds the final optical element and the optical assembly.

13. The apparatus of claim 11, further comprising a pressure sensor that measures the pressure exerted by the immersion fluid on the final optical element and that provides a pressure signal commensurate with the measured pressure to the control system.

14. The apparatus of claim 11, further comprising a position sensor, coupled to the control system, and that measures the position of a lens mount that holds the final optical element.

15. The apparatus of claim 11, wherein the at least one force actuator is internal to a lens mount that holds the final optical element.

16. The apparatus of claim 11, wherein the at least one force actuator is one of the following types of force actuators: a VCM, an El core, a piezo stack, a magnetic actuator, or a pressure actuator.

17. The apparatus of claim 1, further comprising a lens mount that holds the final optical element, wherein the fluid compensation system applies the second force to the lens mount.

18. A device manufacturing method comprising:
exposing a wafer through the optical assembly and the immersion fluid of the apparatus of claim 1; and
developing the exposed substrate.

19. An apparatus, comprising:
a wafer table that supports a wafer;
an optical assembly that projects an image onto the wafer held by the wafer table, the optical assembly having a final optical element spaced from the wafer by a gap;
an immersion element that provides an immersion fluid into the gap between the final optical element and the wafer, the immersion element having one or more gas nozzles that provide a flow of gas;
a pressure sensor that measures the pressure of the immersion fluid in the gap; and
a gas control system, coupled to the pressure sensor, and that controls a velocity of the flow of gas from the one or more gas nozzles based on the pressure measured by the pressure sensor.

20. The apparatus of claim 19, wherein the gas flow from the one or more gas nozzles is used to substantially contain the immersion fluid in the gap.

21. The apparatus of claim 20, wherein the gas flow from the one or more gas nozzles is used to create an air bearing used to support the immersion element.

22. The apparatus of claim 21, wherein the gas control system adjusts the gap between the immersion element and the wafer by controlling the velocity of the gas exiting the one or more gas nozzles.

23. A device manufacturing method comprising:
exposing a wafer through the optical assembly and the immersion fluid of the apparatus of claim 19; and
developing the exposed substrate.

24. An exposure method in which an optical assembly projects an image onto a wafer held by a wafer table, the optical assembly having a final optical element spaced from the wafer by a gap, the method comprising:
providing an immersion fluid into the gap between the final optical element and the wafer using an immersion element, the immersion element having one or more gas nozzles that provide a flow of gas;
measuring the pressure of the immersion fluid in the gap using a pressure sensor; and
controlling a velocity of the flow of gas from the one or more gas nozzles based on the pressure measured by the pressure sensor using a gas control system coupled to the pressure sensor.

25. The method of claim 24, wherein the gas flow from the one or more gas nozzles substantially contains the immersion fluid in the gap.

26. The method of claim 25, wherein the gas flow from the one or more gas nozzles creates an air bearing that supports the immersion element.

27. The method of claim 26, wherein the gas control system adjusts the gap between the immersion element and the wafer by controlling the velocity of the gas exiting the one or more gas nozzles.

* * * * *